Oct. 29, 1968 W. R. RAISANEN 3,408,512

CURRENT MODE MULTIVIBRATOR CIRCUITS

Filed Aug. 23, 1965

INVENTOR
WALFRED R. RAISANEN
BY Thomas J. Nikolai
ATTORNEY

United States Patent Office 3,408,512

Patented Oct. 29, 1968

3,408,512

CURRENT MODE MULTIVIBRATOR CIRCUITS

Walfred R. Raisanen, Phoenix, Ariz., assignor to Sperry Rand Corporation, New York, N.Y., a corporation of Delaware Filed Aug. 23, 1965, Ser. No. 481,723
8 Claims. (Cl. 307—273)

ABSTRACT OF THE DISCLOSURE

An inductively timed monostable multivibrator having like-conductivity type transistors suitable for integration is described. A current mode bistable multivibrator having like-conductivity type transistors suitable for integration is also described. Each circuit utilizes a sharp threshold multiple emitter transistor for supplying desired bias voltages.

Figure 1:
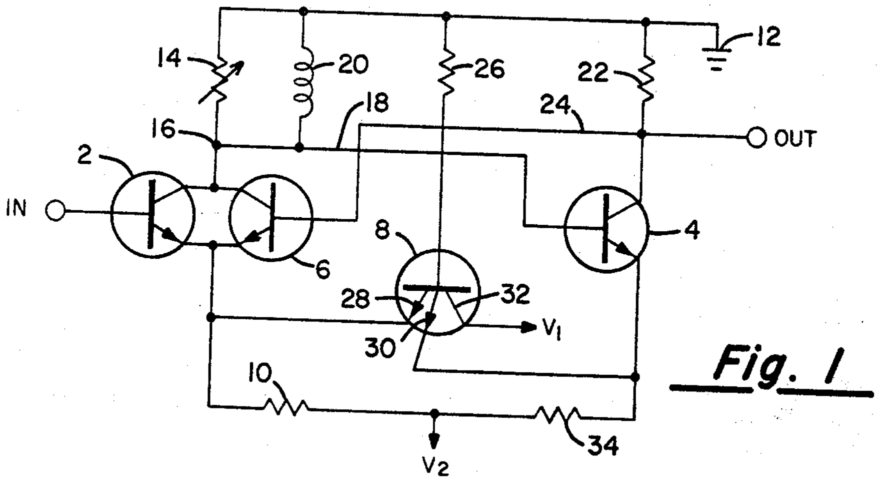

This invention relates to multivibrators and in particular to an inductively controlled monostable multivibrator which produces a pulse of controllable time duration in response to an actuating pulse of shorter time duration and a current mode bistable multivibrator.

Inductively timed single-shot multivibrators are well known in the prior art as shown by Benson, Patent No. 3,065,362 and Schmookler, "Inductively Timed Single-Shot," IBM Technical Disclosure Bulletin, vol. 5, No. 9, February 1963. However, where it is desired to employ integrated circuit technology, the circuits of the Benson and Schmookler devices are somewhat undesirable since they require the simultaneous use of NPN and PNP type transistors. This is difficult within the state-of-art of today's integrated circuit technology which most commonly provides only transistors of a single conductivity type within a single integrated circuit. Further, the formation of the integrated circuit is made more difficult by the great number of components involved in each of these circuits.

The present invention utilizes not only fewer components but also requires transistors of one conductivity type only. Further, a multiple emitter transistor forms only one leg of a current mode logic circuit and is used instead of diodes or other means to establish proper operating voltages in the circuit. An n-emitter transistor facilitates integrated circuit construction since it takes less space than n diodes or n separate transistors; hence it is less costly. Not only does the use of a multiple emitter transistor facilitate construction of the integrated circuit, but it also provides other advantages over the use of diodes when it is operated in its saturated state. Better noise margins are provided since the switching threshold of the multiple emitter transistor is sharper than those of any diode or complementary output transistor. This is true because the collector characteristics of a saturated transistor is the same as a low forward impedance diode.

The fundamental principles involved in the circuit of the inductively timed monostable multivibrator may be used to form a current mode bistable flip-flop which has all the advantages enumerated above. Thus, the current mode bistable flip-flop utilizes not only fewer components but also requires transistors of one conductivity type only. Also, it has a multiple emitter transistor which forms one leg of a current mode logic circuit and is used instead of diodes to establish proper operating voltages in the circuit. The multiple emitter transistor provides the same advantages as set forth above in relation to the inductively timed monostable multivibrator.

It is an object of the present invention to provide an inductively timed monostable multivibrator that utilizes fewer components than prior art devices.

It is also an object of the present invention to provide an inductively timed monostable multivibrator that utilizes all transistors of one conductivity type to facilitate integrated circuit construction.

It is still another object of this invention to provide an inductively timed monostable multivibrator which utilizes a current mode circuit including a saturated multiple emitter transistor to provide proper operating bias voltages.

It is also an object of the present invention to provide a current mode bistable flip-flop which utilizes all transistors of the same conductivity type as well as a multiple emitter transistor for providing proper bias voltages to the circuit.

Figure 3:
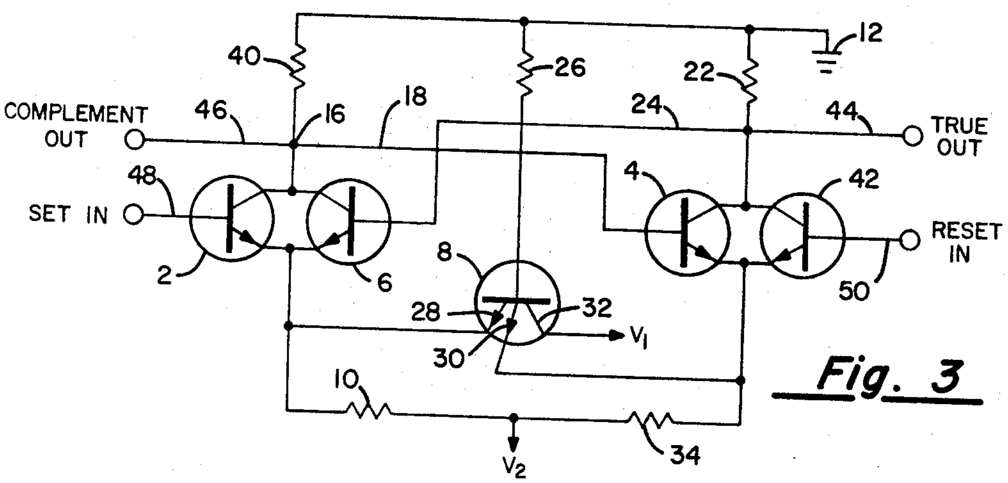
Figure 2:
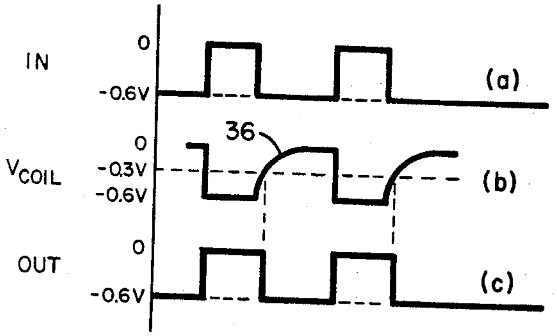

Other objects of the invention will be pointed out in the following description and claims which disclose the principle of the invention and the best mode which has been contemplated of applying that principle as shown and illustrated in the accompanying drawings in which:

FIG. 1 discloses a detailed circuit diagram of the inventive inductively timed monostable multivibrator, and FIG. 2 shows the input and output waveforms as well as the waveform at the collector of transistors 2 and 6, and FIG. 3 is an embodiment of the inventive bistable multivibrator.

As shown in FIG. 1, the inductively timed monostable multivibrator includes input transistor 2, output transistor 4, latching transistor 6 and multiple emitter biasing transistor 8. The emitters of transistors 2 and 6 are coupled in parallel to a first constant current source $V_2$ through resistor 10, while the collectors of transistors 2 and 6 are coupled in parallel to ground potential 12 through variable resistor 14. The junction 16 of the collectors of transistors 2 and 6 and variable resistor 14 is connected by conductor 18 to the base of transistor 4. Inductor 20 is also coupled in parallel with variable resistor 14. Output transistor 4 has its emitter coupled to a second constant current source $V_2$ through resistor 34. The collector of output transistor 4 is connected to ground potential 12 through resistor 22, and is coupled to the base of latching transistor 6 through conductor 24. Multiple emitter transistor 8 has its base connected to ground potential 12 through resistor 26. It also has one of its emitters 28 connected to the junction of resistor 10 and the parallel emitters of transistors 2 and 6 while emitter 30 is coupled to the junction of resistor 34 and the emitter of output transistor 4. The collector 32 of multiple emitter transistor 8 is connected to current source $V_1$.

Transistors 4 and 6, together with transistor 8 and resistors 10, 14, 22, 26, and 34 form a current mode flip-flop. In the stable state, inductor 20 forms a short circuit path for direct current and holds the base of transistor 4 at ground potential causing transistor 4 to conduct. The output of transistor 4 on its collector is a negative potential as shown in FIG. 2(*C*). This negative potential is coupled to the base of transistor 6 via conductor 24 thus holding it off or in the nonconductive state. Current from the first constant current source, $V_2$ and resistor 10, flows through emitter 28 of multiple emitter transistor 8 and base resistor 26 to ground potential 12. Current from the second constant current source, $V_2$ and resistor 34, flows through transistor 4 and base resistor 22 to ground. Since transistor 4 is conducting while transistor 6 is nonconducting, the voltage drop across resistors 10 and 34 establish the proper bias voltages for transistors 2, 4, and 6.

When a positive input pulse shown in FIG. 2(*a*) is applied to the base of transistor 2, it begins to conduct thus diverting the current flow from emitter 28 of transistor 8 to the emitter of transistor 2. The voltage drop now developed across variable resistor 14 is coupled not only to the base of transistor 4 causing it to be cutoff but also to inductor 20 which stores the energy therein.

Transistor 4, being cut-off, allows the output voltage to rise to ground potential. This ground potential is coupled via conductor 24 to the base of transistor 6 which causes transistor 6 to begin to conduct. The input pulse to the base of the transistor 2 may be removed after transistor 6 begins to conduct and transistor 6 will continue to conduct and apply a negative voltage to the base of transistor 4 holding it off until a time, T, after a steady state voltage is obtained on the collector of transistor 6. The voltage across inductor 20 and thus on the collectors of transistors 2 and 6 is shown by the waveform in FIG. 2(*b*). When the inductor has charged up to a sufficiently positive value, in a time about equal to 0.5 L/R, shown in FIG. 2(*b*) as point 36, the base of transistor 4 becomes sufficiently positive and it begins to conduct thus causing the voltage on its collector to return to −0.6 volt, as shown by the output waveform in FIG. 2(*c*). The circuit then latches back into its stable state with transistors 2 and 6 nonconducting and transistor 4 conducting. Inductor 20 will completely dissipate its energy through resistor 14 and will again become a D.C. short to ground thus applying D.C. ground potential to the base of transistor 4.

The fundamental principles involved in the circuit of FIG. 1 may be used to form a current mode bistable flip-flop which has all the advantages enumerated above. Thus the current mode bistable flip-flop utilizes not only fewer components but also requires transistors of one conductivity type only. Also, a multiple emitter transistor forms one leg of a current mode logic circuit and is used instead of diodes to establish proper operating voltages in the circuit. As in the inductively timed monostable multivibrator, the use of a multiple emitter transistor facilitates construction of the integrated circuit in that it reduces the number of components involved and it also provides better noise margins when operated in its saturated state since the switching threshold of the multiple emitter transistor is sharper than those of any diode.

The circuit of the current mode bistable flip-flop shown in FIG. 3 differs in three respects from the circuit of the inductively timed monostable multivibrator shown in FIG. 1. First, inductor 20 in FIG. 1 has been removed. Second, variable resistor 14 has been removed and replaced with a fixed resistor. Third, an additional transistor 42 has been added in FIG. 3 with its collector and emitter respectively connected in parallel with the collector and emitter of transistor 4 of FIG. 1. All other elements of FIG. 1 are like numbered in FIG. 3 for purposes of clarity.

Consider now the operation of the circuit shown in FIG. 3. Assume that transistor 4 is conducting and causing a negative signal on TRUE output line 44 while transistors 2, 4, and 42 are non-conducting. A ground potential signal will be present on COMPLEMENT output line 46. Proper bias voltages are supplied by multiple emitter transistor 8 to the emitters of transistors 2, 4, 6, and 42.

A SET signal of positive polarity applied to input line 48 will be coupled to the base of transistor 2 causing it to begin to conduct. The voltage developed across resistor 40 at junction 16 will be coupled by conductor 18 to the base of transistor 4. Since this is a negative voltage, transistor 4 will cease conducting and cause ground potential to appear on TRUE output line 44. This ground potential is also coupled to the base of transistor 6 by conductor 24 and transistor 6 begins to conduct. At this point, the SET input signal can be removed from the base of transistor 2. The flip-flop then stays latched in this condition with transistor 6 conducting and transistors 2, 4, and 42 nonconducting. The negative signal developed across collector resistor 40 is also present on COMPLEMENT output line 46.

When it is desired to RESET the circuit or place it in its original stable state, a positive polarity RESET pulse is applied to the base of transistor 42 on line 50. Transistor 42 begins to conduct which causes a negative voltage to be developed across collector resistor 22 on output line 44. This negative voltage is also coupled to the base of conducting transistor 6. This negative voltage causes transistor 6 to cease conducting. The voltage at junction 16, and COMPLEMENT output line 46, rises to ground potential, and is coupled by conductor 18 to the base of transistor 4 thus causing transistor 4 to begin to conduct. At this time the RESET pulse may be removed from the base of transistor 42. Thus, the circuit is once again in its initial stable state with transistor 4 conducting and transistors 2, 6, and 42 nonconducting. The circuit will remain in this state until a SET pulse is appled to the base of transistor 2 on line 48.

Thus the circuit as shown and described above is simple and efficient and is well adapted for formation in integrated circuits.

It is understood that suitable modifications may be made in the structure as disclosed provided such modifications come within the spirit and scope of the appended claims. Having now, therefore, fully illustrated and described my invention, what I claim to be new and desire to protect by Letters Patent is set forth in the appended claims:

What is claimed is:

1. An inductively timed monostable multivibrator for generating an output pulse of controllable time duration in response to an input pulse of shorter time duration, said multivibrator comprising:

(a) three transistors of like conductivity type and each having three terminals, (b) input means coupled to a first terminal of said first transistor for causing said first transistor to produce an output on a second one of its terminals whenever an input pulse is received, (c) a parallel resistor-inductor combination for coupling between a first potential and the second terminal of said first transistor and the first terminal of said second transistor for storing the signal produced by said first transistor, (d) a load resistor for coupling between said first potential and the second terminal of said second transistor, (e) means coupling the second terminal of said first transistor to the first terminal of said second transistor and the second terminal of the second transistor to the first terminal of the third transistor whereby the signal stored by said inductor-resistor combination causes said second transistor to produce an output signal on its second terminal, said output signal causing said third transistor to produce a latching signal which holds said output signal across said load resistor until said stored energy in said inductor is dissipated across said parallel resistor, and (f) means forming a current mode circuit for coupling between said first potential and the third terminal of each of said three transistors for providing bias voltages thereon.

2. An inductively timed monostable multivibrator as in claim 1 wherein said means forming said current mode circuit comprises:

(a) current source means comprising first and second constant current sources, (b) a multiple emitter transistor including:

(1) a base, (2) a collector for coupling to a second potential, and (3) multiple emitters, one of said emitters coupled to said first and third transistors and said current source means for utilizing the first constant current source, and another one of said emitters coupled to said second transistor and said current source means for utilizing the second constant current source, and (c) a resistor for coupling the base of said multiple emitter transistor to said first potential.

3. An inductively timed monostable multivibrator as in claim 2 wherein:

(a) said first, second and third terminals of each of said transistors are the base, collector and emitter respectively.

4. An inductively timed monostable multivibrator for generating an output pulse of controllable time duration in response to an input pulse of shorter time duration, said multivibrator comprising:

(a) three transistors each having a base, a collector and an emitter, (b) input means coupled to the base of said first transistor to cause said first transistor to produce a signal on its collector whenever an input pulse is received, (c) first and second constant current suorces and first and second potential sources, (d) an inductor with one end connected to said first potential source, (e) means coupling the collector of said first transistor to the other end of said inductor to enable said signal to store energy therein and to the base of said second transistor for changing the state thereof to cause an output pulse of controllable time duration on its collector, (f) said collector of said second transistor being coupled to said first potential source and to the base of said third transistor to cause said third transistor to produce a signal on the collector thereof, (g) means for connecting the collector of said third transistor to the base of said second transistor so that the signal on the collector of said third transistor will hold said second transistor in its changed state when the input pulse to the base of said first transistor is removed, (h) a resistor coupled in parallel with said inductor, said third transistor holding said second transistor in its changed state until said stored energy in said inductor is dissipated through said resistor, (i) means connecting said emitters of said first and third transistors to said first constant current source, (j) means connecting said emitter of said second transistor to said second constant current source, (k) a fourth transistor having a plurality of emitters, a collector and a base, (l) means connecting the base of said fourth transistor to said first potential source, (m) means coupling a first of said plurality of emitters to said emitters of said first and third transistors for providing a bias thereto, (n) means coupling a second one of said plurality of emitters to the emitter of said second transistor for proviidng a proper bias thereto, and (o) means connecting the collector of said fourth transistor to said second potential source.

5. A current mode bistable flip-flop comprising:

(a) four transistors of like conductivity type each having first, second and third terminals, (b) a first resistor connected betwen a first potential source and the second terminal of each of said first and third transistors, (c) a second resistor connected between said first potential source and the second terminal of each of said second and fourth transistors, (d) first input means coupled to the first terminal of said first transistor to cause it to produce a signal on its second terminal whenever a first input pulse is received, (e) means coupling the second terminal of said first transistor to the first terminal of said second transistor for changing the state of said second transistor causing it to produce an output signal on its second terminal, (f) means coupling the second terminal of said second transistor to the first terminal of said third transistor to make said third transistor produce a latching signal on its second terminal, (g) second input means coupled to the first terminal of said fourth transistor for causing it to produce a signal which changes the states of said second and third transistors to cause an output signal on the second terminal of said third transistor and a latching signal on the second terminal of said second transistor, and (h) means including a multiple emitter transistor, coupled to the third terminal of each transistor for forming a current mode circuit for establishing bias voltages thereon.

6. A bistable flip-flop as in claim 5 wherein said last mentioned means comprises:

(a) current source means comprising first and second constant current sources, (b) a multiple emitter transistor including:

(1) a base, a collector and multiple emitters, (2) one of said multiple emitters connected to the emitter of each of said first and third transistors for coupling to the first constant current source and another of said multiple emitters connected to the emitter of each of the second and fourth transistors for coupling to the second constant current source, (c) a resistor for coupling the base of said multiple emitter transistor to said first potential source, and (d) means for coupling said collector of said multiple emitter transistor to a second potential source.

7. A bistable multivibrator as in claim 6 wherein:

(a) said first, second and third terminals of each of said transistors are the base, collector and emitter respectively.

8. A current mode bistable flip-flop comprising:

(a) four transistors each having a base, a collector and an emitter, (b) first means for coupling to a source of potential, (c) a first resistor connecting said first means to the collector of each of said first and third transistors, (d) a second resistor connecting said first means to the collector of each of said second and fourth transistors, (e) first input means coupled to the base of said first transistor for causing said first transistor to produce an output signal on its collector whenever a first input pulse is received, (f) second means coupling the collector of said first transistor to the base of said second transistor to prevent said second transistor from producing an output signal on the collector thereof in response to said first input signal, (g) third means coupling the collector of said second transistor to the base of said third transistor to cause said third transistor to produce a latching signal on the collector thereof, (h) second input means coupled to the base of said fourth transistor for causing it to produce a signal which changes the states of said second and third transistors whenever a second input pulse is received, said changed states causing an output signal on the second terminal of said third transistor and a latching signal on the second terminal of said second transistor, and (i) fourth means forming a current mode circuit coupled to the emitter of each transistor for establishing bias voltages thereof, said fourth means including:

(1) current source means comprising first and second constant current sources, (2) a multiple emitter transistor including:

(i) a base, (ii) collector means for coupling to a second potential, and (iii) multiple emitters, one of said emitters coupled to said first and third transistors and said current source means for utilizing the first constant current source, and another one of said emitters coupled to said second and fourth transistors and said current source means for utilizing the second constant current source, and (3) a resistor for coupling the base of said multiple emitter transistor to said first means.

References Cited

UNITED STATES PATENTS

| | | | |
|---|---|---|---|
| 2,967,951 | 1/1961 | Brown | 307—88.5 |
| 3,178,584 | 4/1965 | Clark | 307—88.5 |
| 3,229,119 | 1/1966 | Bohn et al. | 307—88.5 |
| 3,284,677 | 11/1966 | Haas | 317—235 |
| 3,317,750 | 5/1967 | Narud et al. | 307—88.5 |

ARTHUR GAUSS, *Primary Examiner.*

STANLEY D. MILLER, *Assistant Examiner.*